(12) United States Patent
Gadre et al.

(10) Patent No.: US 11,011,371 B2
(45) Date of Patent: May 18, 2021

(54) SIBN FILM FOR CONFORMAL HERMETIC DIELECTRIC ENCAPSULATION WITHOUT DIRECT RF EXPOSURE TO UNDERLYING STRUCTURE MATERIAL

(71) Applicant: Applied Materials, Inc., Santa Clara, CA (US)

(72) Inventors: Milind Gadre, Santa Clara, CA (US); Shaunak Mukherjee, Santa Clara, CA (US); Praket P. Jha, San Jose, CA (US); Deenesh Padhi, Sunnyvale, CA (US); Ziqing Duan, Sunnyvale, CA (US); Abhijit B. Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/462,513

(22) PCT Filed: Nov. 16, 2017

(86) PCT No.: PCT/US2017/061976
§ 371 (c)(1),
(2) Date: May 20, 2019

(87) PCT Pub. No.: WO2018/118288
PCT Pub. Date: Jun. 28, 2018

(65) Prior Publication Data
US 2019/0326110 A1    Oct. 24, 2019

Related U.S. Application Data

(60) Provisional application No. 62/437,986, filed on Dec. 22, 2016.

(51) Int. Cl.
*H01L 21/02* (2006.01)
*C23C 16/34* (2006.01)
(Continued)

(52) U.S. Cl.
CPC ........ *H01L 21/0217* (2013.01); *C23C 16/345* (2013.01); *C23C 16/38* (2013.01);
(Continued)

(58) Field of Classification Search
CPC . C23C 16/38; C23C 16/345; H01L 21/02123; H01L 21/0217; H01L 21/02211;
(Continued)

(56) References Cited

U.S. PATENT DOCUMENTS

2002/0142624 A1\* 10/2002 Levy ................. H01L 21/02337
                                                        438/786
2008/0292798 A1\* 11/2008 Huh ...................... C23C 16/342
                                                        427/343

(Continued)

OTHER PUBLICATIONS

International Search Report and Written Opinion dated Mar. 12, 2018 for Application No. PCT/US2017/061976.

*Primary Examiner* — John A Bodnar
(74) *Attorney, Agent, or Firm* — Patterson + Sheridan, LLP

(57) ABSTRACT

Embodiments disclosed herein relate to methods for forming memory devices, and more specifically to improved methods for forming a dielectric encapsulation layer over a memory material in a memory device. In one embodiment, the method includes thermally depositing a first material over a memory material at a temperature less than the temperature of the thermal budget of the memory material, exposing the first material to nitrogen plasma to incorporate nitrogen in the first material, and repeating the thermal deposition and nitrogen plasma operations to form a hermetic, conformal dielectric encapsulation layer over the memory material. Thus, a memory device having a hermetic, conformal dielectric encapsulation layer over the memory material is formed.

19 Claims, 2 Drawing Sheets

(51) Int. Cl.
*H01L 21/768* (2006.01)
*C23C 16/38* (2006.01)

(52) U.S. Cl.
CPC .... *H01L 21/0228* (2013.01); *H01L 21/02211* (2013.01); *H01L 21/02252* (2013.01); *H01L 21/76834* (2013.01)

(58) Field of Classification Search
CPC ....... H01L 21/02252; H01L 21/022329; H01L 21/0234; H01L 21/0228
See application file for complete search history.

(56) References Cited

U.S. PATENT DOCUMENTS

| | | | |
|---|---|---|---|
| 2012/0141922 A1 | 6/2012 | Deweerd | |
| 2014/0356549 A1 | 12/2014 | Varadarajan | |
| 2015/0147484 A1 | 5/2015 | Nguyen et al. | |
| 2016/0093484 A1 | 3/2016 | Marsh | |
| 2016/0141258 A1* | 5/2016 | Jain | H01L 23/28 257/787 |
| 2016/0148806 A1* | 5/2016 | Henri | H01L 21/0217 438/775 |
| 2017/0323785 A1* | 11/2017 | Singhal | H01L 21/02164 |

\* cited by examiner

SIBN FILM FOR CONFORMAL HERMETIC DIELECTRIC ENCAPSULATION WITHOUT DIRECT RF EXPOSURE TO UNDERLYING STRUCTURE MATERIAL

BACKGROUND

Field

Embodiments disclosed herein relate to methods for forming memory devices, and more specifically to methods for forming a dielectric encapsulation layer over a high aspect ratio material, such as a transition metal based material of a memory cell device.

Description of the Related Art

Nonvolatile Random Access Memory (RAM) devices generally include millions of memory cells containing transition metal based materials such as copper (Cu), useful for memory storage in 0(s) and 1(s). Dielectrically separating memory material from metal interconnects that manage the memory state contributes to maximizing operation of the memory cells. Deposition of dielectric encapsulation materials is typically achieved by high-temperature, plasma treatment processes, such as Plasma Enhanced-CVD (PECVD). However, the memory materials have a fixed thermal budget to avoid thermal damage. Additionally, memory materials are also sensitive to plasma damage. If the sensitive memory material is degraded, the storage capability of the memory material is generally reduced or completely eliminated.

Therefore, there is a need for improved methods for depositing dielectric encapsulation layers for memory devices.

SUMMARY

Embodiments disclosed herein relate to methods for forming memory devices, and more specifically to improved methods for forming a dielectric encapsulation layer over a memory material in a memory device. In one embodiment, the method includes thermally depositing a first material over a memory material at a temperature less than the temperature of the thermal budget of the memory material, exposing the first material to nitrogen plasma to incorporate nitrogen in the first material, and repeating the thermal deposition and nitrogen plasma operations to form a hermetic, conformal dielectric encapsulation layer over the memory material. Thus, a memory device having a hermetic, conformal dielectric encapsulation layer over the memory material is formed.

In one embodiment, a method is disclosed. The method includes thermally depositing a first material over a memory material by flowing first precursors over the memory material at a temperature less than a thermal budget of the memory material, exposing the first material to a nitrogen plasma to incorporate nitrogen in the first material, and repeating the thermally depositing the first material and the exposing the first material to the nitrogen plasma to form a dielectric encapsulation layer having a predetermined thickness over the memory material.

In another embodiment, a method is disclosed. The method includes depositing a first material over a memory material by a thermal chemical vapor deposition process, which includes flowing a silicon-containing first precursor comprising one or more of silane and disilane and flowing a boron-containing first precursor comprising diborane over the memory material at a temperature less than about 300° C., and reacting the silicon-containing first precursor and the boron-containing first precursor to deposit the first material, exposing the first material to a nitrogen plasma comprising one or more nitrogen-containing gases selected from the group consisting of nitrogen gas and ammonia, and repeating the depositing the first material and the exposing the first material to the nitrogen plasma to form a conformal nitrogen-doped silicon boride dielectric encapsulation layer over the memory material.

In yet another embodiment, a memory device is disclosed. The memory device includes a substrate, a memory material disposed over portions of the substrate, and a dielectric encapsulation layer comprising SiBN disposed over the memory material and exposed portions of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein relate to methods for forming memory devices, and more specifically to improved methods for forming a dielectric encapsulation layer over a memory material in a memory device. In one embodiment, the method includes thermally depositing a first material over a memory material at a temperature less than the temperature of the thermal budget of the memory material, exposing the first material to nitrogen plasma to incorporate nitrogen in the first material, and repeating the thermal deposition and nitrogen plasma operations to form a hermetic, conformal dielectric encapsulation layer over the memory material. Thus, a memory device having a hermetic, conformal dielectric encapsulation layer over the memory material is formed.

Figure 1:
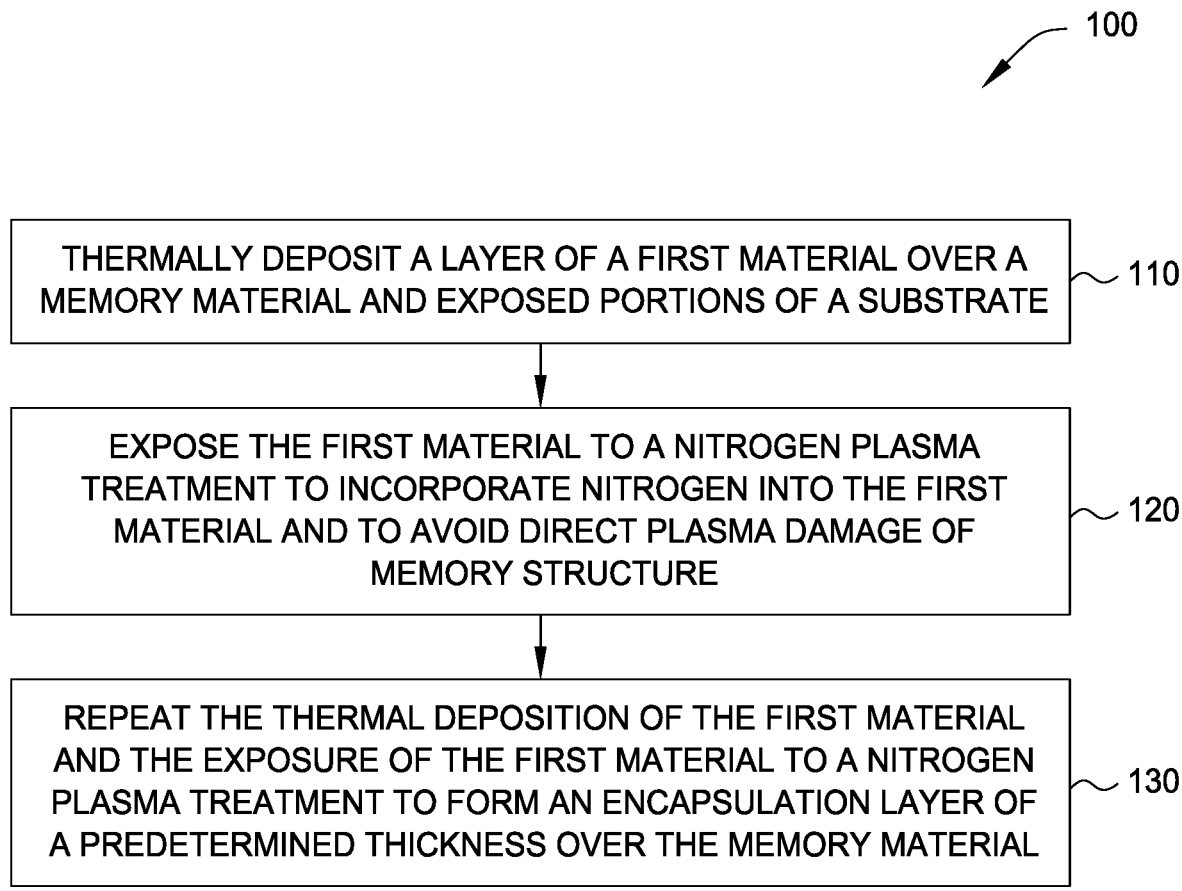
FIG. 1 is a process flow for depositing a dielectric encapsulation layer.

FIG. 1 is a process flow 100 for depositing a dielectric encapsulation layer. The process flow 100 begins at operation 110 by thermally depositing a layer of a first material over a memory material and exposed portions of a substrate of a device. At operation 120, the device is exposed to a nitrogen plasma treatment to incorporate a nitride into the first material. At operation 130, operations 110 and 120 are cyclically repeated, until a dielectric encapsulation layer of suitable thickness has been deposited over the memory material and exposed portions of the substrate. The process flow 100 forms a dielectric encapsulation layer over the memory material of the device without high temperature or plasma treatment processes, which may damage the memory material.

Figure 2A:
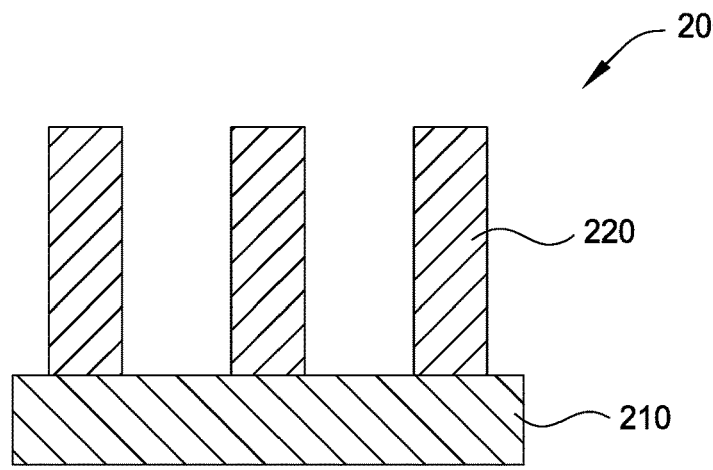
FIGS. 2A-2C are cross-sectional views of a device formed according to a process flow disclosed herein.
Figure 2B:
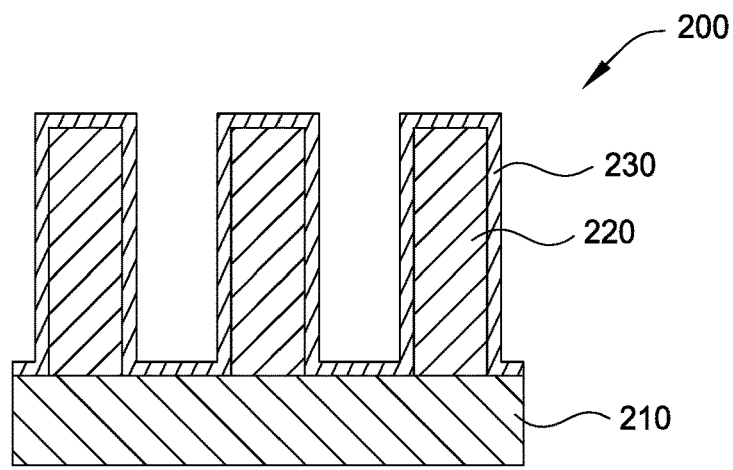
Figure 2C:
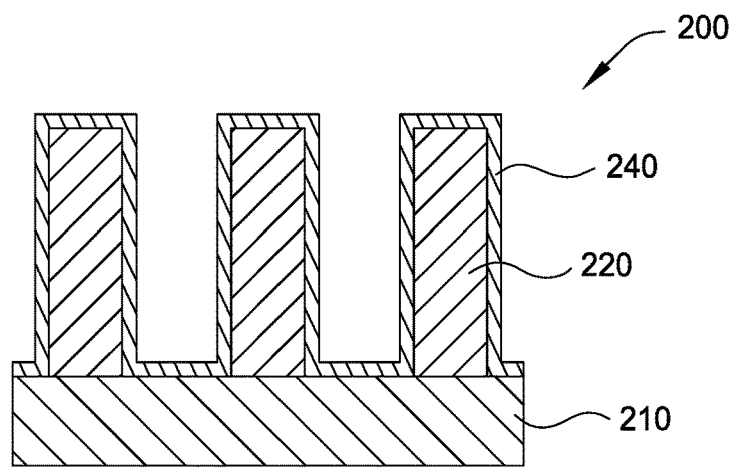

FIGS. 2A-2C are cross-sectional views of a device 200, such as a memory device, formed according to a process flow disclosed herein, such as the process flow 100. As shown in FIG. 2A, the device 200 includes a substrate 210 and memory material 220. The substrate 210 is generally any suitable substrate material(s), including but not limited to, silicon substrate materials, including amorphous, poly-, or crystalline silicon, as well as germanium or silicon-germanium substrates. The memory material 220, which is used to store information to memory, generally includes any suitable memory material(s), including but not limited to, copper (Cu), iron (Fe), Hafnium (Hf) and/or Cobalt (Co). The memory material 220 generally forms one or more features over the substrate 210. In the embodiment illustrated in FIG. 2A, the one or more features of memory material 220 are separated by one or more trenches on and in contact with the substrate 210; however, the features may be any suitable shape and size. In one embodiment, the device 200 has a high aspect ratio, for example, an aspect ratio of 90 nanometers (nm) by 40 nm. The aspect ratio generally refers to the ratio of the height (h) compared to the width (w) of the one or more features. In further embodiments, the device 200 may have any other suitable aspect ratios, such as 3:1, 4:1, 5:4, 4:3, 16:10 and 16:9.

In one embodiment, the thermal deposition is a thermal chemical vapor deposition (CVD). Thermal deposition of the first material 230 generally includes flowing first material precursors over the memory material 220 and exposed portions of the substrate 210 at a process temperature less the thermal budget of the memory material 220. In one embodiment, the process temperature is less than about 300 degrees Celsius (° C.), for example, between about 200° C. and about 250° C., such as at about 235° C. The first precursors generally include, but are not limited to, a silicon (Si)-containing precursor and/or a boron (B)-containing precursor. Examples of the silicon-containing first precursor include, but are not limited to, silane ($SiH_4$) and/or disilane ($Si_2H_6$), or higher order silanes. An example of the boron first precursor is diborane ($B_2H_6$). Carrier gases for the first precursors include, but are not limited to, argon (Ar) and helium (He). The gas flow rate for the silicon-containing first precursor is generally between about 100 standard cubic cm per minute (sccm) and about 700 sccm. The gas flow rate for the boron first precursor is generally between about 20 sccm and about 400 sccm. The gas flow rate for argon is generally between about 5 liters per minute (Lpm) and about 10 Lpm. The gas flow rate for helium is generally between about 1 Lpm and about 5 Lpm.

The first precursors react with one another to form a first layer of a first material 230 over the memory material 220 and the exposed portions of the substrate 210. In an example using silicon-containing and boron-containing precursors, the first material 230 is a silicon boride ($SiB_n$) material or a boron doped amorphous silicon (aSi) material. However, the first material may include other materials, which can absorb nitrogen as described below. Since the first layer of first material 230 is deposited at a low temperature and without plasma, the memory material 220 is unharmed. Whereas, in contrast, conventional dielectric encapsulation layer deposition methods use high temperature and/or plasma treatments, which damage the memory material. The first layer of the first material 230 may be between about 5 angstroms (Å) and about 50 Å, for example between about 10 Å and about 30 Å, or between about 15 Å and about 25 Å, such as about 20 Å.

After the first layer of the first material 230 has been deposited over the memory material 220, the device 200 undergoes a nitridation process. More specifically, the device 200 is generally exposed to a nitrogen plasma treatment to form a dielectric encapsulation layer 240 having a nitrogen content. In one embodiment, the device 200 is exposed to a nitrogen plasma treatment to incorporate nitrogen, such as a nitride, into the first material 230. The nitrogen plasma treatment generally includes exposing the first material to a nitrogen-containing gas, such as nitridation gas. Examples of a nitrogen-containing gas include, but are not limited to, nitrogen gas ($N_2$) and/or ammonia ($NH_3$). The gas flow rate for the nitrogen gas is generally between about 5 Lpm and about 8 Lpm. The gas flow rate for the ammonia gas is generally between about 500 sccm and about 2 Lpm. The plasma power for the nitrogen plasma treatment is generally between about 100 Watts (W) and about 500 W at a plasma frequency of about 13.56 megahertz (MHz) (e.g., high-frequency RF).

The nitrogen plasma reacts with the first layer of the first material 230 and incorporates a nitrogen, for example, nitridates, the first material 230 to form a dielectric encapsulation layer 240. When silicon-containing and boron-containing first precursors are used to deposit the first material 230, the resulting dielectric encapsulation layer 240 includes a nitrogen-doped silicon boride (SiBN).

The deposition and nitridation processes are cyclically repeated until a dielectric encapsulation layer 240 of a predetermined thickness has been deposited over the memory material 220 and exposed portions of the substrate 210, as shown in FIG. 2C. The predetermined thickness may be, for example, between about 200 Å and about 300 Å. In an embodiment where the predetermined thickness of the dielectric encapsulation layer 240 is about 200 Å and the process flow includes thermally depositing about 20 Å of the first material, the deposition and nitridation processes are generally repeated about 10 times. In an embodiment where the predetermined thickness of the dielectric encapsulation layer 240 is about 300 Å and the process flow includes thermally depositing about 20 Å of the first material 230, the deposition and nitridation processes are repeated about 15 times.

Benefits of the described methods for depositing dielectric encapsulation layers include, but are not limited to, formation of a thin (e.g., a few nanometers or less), hermetic and conformal dielectric layer having low leakage current and high breakdown voltage over a memory material without exposing the memory material to a high temperature or plasma process. Since the methods described herein are performed at low temperatures and without exposing the memory material to a plasma, the integrity of the memory material is maintained such that the memory material may effectively store information. Additionally, the hermetic property of the dielectric encapsulation layer reduces or prevents moisture diffusion and other damage to the memory-bearing material.

Embodiments described herein deposit a first material over memory material and exposed portions of a substrate under low temperature conditions. The low temperature conditions minimize or avoid damage to memory material, which would otherwise be caused using high temperature of plasma processes. Subsequently, the first material is exposed to nitride or nitrogen ions or radicals to nitridize the first film, thus forming a dielectric encapsulation film. The dielectric encapsulation film may be formed using a plasma process, because the first film protects the memory material from exposure to the plasma, and thus, protects the memory material from damage due to plasma exposure. The utilization of cyclical deposition and nitridization permits adequate and uniform nitridation of the final encapsulation material.

While the foregoing contemplates depositing a dielectric encapsulation layer on a memory device, such as a PRAM device, the methods described herein are applicable for depositing a dielectric encapsulation layer on any temperature-sensitive and plasma-sensitive device or material for which encapsulation to protect from heat, moisture, and/or plasma is desired.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
thermally depositing a first material over a memory material by flowing one or more first precursors over the memory material at a temperature less than a thermal budget of the memory material, the one or more first precursors comprising a silicon-containing precursor and a boron-containing precursor;
exposing the first material to a nitrogen plasma to incorporate nitrogen in the first material; and
repeating the thermally depositing the first material and the exposing the first material to the nitrogen plasma to form a dielectric encapsulation layer having a predetermined thickness over the memory material.

2. The method of claim 1, wherein the temperature is less than about 300 degrees Celsius.

3. The method of claim 1, wherein the silicon-containing precursor comprises one or more of silane ($SiH_4$) and disilane ($Si_2H_6$).

4. The method of claim 1, wherein the nitrogen plasma comprises one or more of nitrogen gas ($N_2$) and ammonia ($NH_3$).

5. The method of claim 4, wherein the nitrogen plasma comprises $N_2$ and a flow rate of $N_2$ is between about 5 liters per minute and about 8 liters per minute.

6. The method of claim 1, wherein the dielectric encapsulation layer comprises nitrogen-doped silicon boride (SiBN).

7. The method of claim 1, wherein the predetermined thickness of the dielectric encapsulation layer is between about 200 angstroms and about 300 angstroms.

8. A method, comprising:
depositing a first material over a memory material by a thermal chemical vapor deposition process comprising:
flowing a silicon-containing first precursor comprising one or more of silane and disilane;
flowing a boron-containing first precursor comprising diborane over the memory material at a temperature less than about 300 degrees Celsius; and
reacting the silicon-containing first precursor and the boron-containing first precursor to deposit the first material;
exposing the first material to a nitrogen plasma comprising one or more nitrogen-containing gases selected from the group consisting of nitrogen gas and ammonia; and
repeating the depositing the first material and the exposing the first material to the nitrogen plasma to form a conformal nitrogen-doped silicon boride dielectric encapsulation layer over the memory material.

9. The method of claim 8, wherein the temperature is between about 200 degrees Celsius and about 250 degrees Celsius.

10. The method of claim 8, wherein the depositing the first material and the exposing the first material to the nitrogen plasma are repeated between about 10 times and about 15 times.

11. The method of claim 8, wherein a flow rate of the silicon-containing first precursor is between about 100 standard cubic centimeters per minute and about 700 standard cubic centimeters per minute.

12. The method of claim 8, wherein a plasma power for the exposing the first material to a nitrogen plasma is between about 100 Watts and about 500 Watts.

13. A memory device, comprising:
a substrate;
one or more high aspect ratio features of memory material disposed over portions of the substrate; and
a dielectric encapsulation layer comprising nitrogen-doped silicon boride (SiBN) disposed over the one or more high aspect ratio features of memory material and exposed portions of the substrate.

14. The memory device of claim 13, wherein a thickness of the dielectric encapsulation layer is between about 200 angstroms and about 300 angstroms.

15. The method of claim 1, wherein the first material comprises one or more of a silicon boride ($SiB_n$) material or a boron doped amorphous silicon (aSi) material.

16. The method of claim 1, wherein a thickness of the first material is between about 5 angstroms and about 50 angstroms.

17. The method of claim 3, wherein the boron-containing precursor is diborane ($B_2H_6$).

18. The method of claim 4, wherein the nitrogen plasma comprises $NH_3$ and a flow rate of $NH_3$ is between about 500 standard cubic centimeters per minute and about 2 liters per minute.

19. The method of claim 8, wherein a flow rate of the boron-containing first precursor is between about 20 standard cubic centimeters per minute and about 400 standard cubic centimeters per minute.

* * * * *